(12) United States Patent
Yan et al.

(10) Patent No.: US 9,620,568 B2
(45) Date of Patent: Apr. 11, 2017

(54) DISPLAY SUBSTRATE, FABRICATING METHOD THEREOF AND DISPLAY APPARATUS

(71) Applicant: Boe Technology Group Co., LTD., Beijing (CN)

(72) Inventors: Guang Yan, Beijing (CN); Changyen Wu, Beijing (CN); Li Sun, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 14/907,235

(22) PCT Filed: Jul. 20, 2015

(86) PCT No.: PCT/CN2015/084428
§ 371 (c)(1),
(2) Date: Jan. 22, 2016

(87) PCT Pub. No.: WO2016/123916
PCT Pub. Date: Aug. 11, 2016

(65) Prior Publication Data
US 2016/0372525 A1    Dec. 22, 2016

(30) Foreign Application Priority Data

Feb. 6, 2015   (CN) .......................... 2015 1 0065091

(51) Int. Cl.
*H01L 35/24*      (2006.01)
*H01L 51/00*      (2006.01)
(Continued)

(52) U.S. Cl.
CPC ........ *H01L 27/3213* (2013.01); *H01L 51/001* (2013.01); *H01L 51/5008* (2013.01);
(Continued)

(58) Field of Classification Search
CPC ............. H01L 27/3213; H01L 51/5206; H01L 51/5221
(Continued)

(56) References Cited

U.S. PATENT DOCUMENTS 8,421,083 B2 * 4/2013 Yamazaki ........... H01L 27/1225
257/71
2014/0027732 A1    1/2014 Pyo et al.

FOREIGN PATENT DOCUMENTS

| CN | 104659067 | 5/2015 |
| EP | 2525424 | 11/2012 |
| KR | 20020016128 | 3/2002 |

OTHER PUBLICATIONS

International Search Report and Written Opinion with English Language Translation, dated Dec. 4, 2015, Application No. PCT/CN2015/084428.

* cited by examiner

*Primary Examiner* — David S Blum
(74) *Attorney, Agent, or Firm* — Blakely Sokoloff Taylor & Zafman LLP

(57) ABSTRACT

The present invention provide a display substrate, a fabricating method thereof, and a display apparatus, and belongs to the field of display technology. The display substrate comprises a plurality of pixels, each of the pixels is divided into a plurality of light emitting units, each of the light emitting units comprises an anode, a cathode, a carrier transport layer, and a light emitting layer, wherein at least one of the plurality of light emitting units comprises a light emitting layer and at least one process auxiliary layer; the process auxiliary layer and the light emitting layer in other light emitting units are formed into an integral portion from a same material in a film forming process. Display resolution can be improved in the present invention.

20 Claims, 5 Drawing Sheets

(51) Int. Cl.
*H01L 21/00* (2006.01)
*H01L 21/84* (2006.01)
*H01L 27/32* (2006.01)
*H01L 51/52* (2006.01)
*H01L 51/50* (2006.01)
*H01L 51/56* (2006.01)

(52) U.S. Cl.
CPC ...... *H01L 51/5012* (2013.01); *H01L 51/5056* (2013.01); *H01L 51/5072* (2013.01); *H01L 51/5096* (2013.01); *H01L 51/5206* (2013.01); *H01L 51/5221* (2013.01); *H01L 51/5265* (2013.01); *H01L 51/56* (2013.01); *H01L 2251/558* (2013.01)

(58) Field of Classification Search
USPC .............................. 257/40; 438/158, 28, 29
See application file for complete search history.

DISPLAY SUBSTRATE, FABRICATING METHOD THEREOF AND DISPLAY APPARATUS

FIELD OF THE INVENTION

The present invention relates to the field of display technology, and particularly to a display substrate, a fabricating method thereof, and a display apparatus.

BACKGROUND OF THE INVENTION

With continuous development of display technology, many kinds of light emitting components have been applied in a display apparatus. An organic light emitting diode (OLED) is a very common light emitting component in the display apparatus. A display apparatus based on the OLED light emitting component has become popular due to advantages that it is light and thin, has a low power consumption, wide viewing angle, and fast response.

In the OLED display apparatus, the OLED comprises a multi-layer structure. Generally, the multi-layer structure comprises an anode, a hole transport layer, a light emitting layer, an electron transport layer, and a cathode. In a feasible production process, the anode is formed on a substrate. Then, the hole transport layer, the light emitting layer, and the electron transport layer are in sequence arranged over the anode by a film forming process (e.g., vacuum thermal evaporation, organic vapor deposition, or the like). Finally, the cathode is arranged as a topmost layer, and the OLED of a multi-layer structure is completed. Generally, each OLED is divided into a plurality of light emitting units, each of which comprises a light emitting layer of a primary color.

SUMMARY OF THE INVENTION

In the process of realizing the present invention, inventors have found that at least the following problems exist in the prior art. During forming films for a hole transport layer, a light emitting layer, and an electron transport layer onto a substrate by using organic materials, due to limitations in the film forming process, the result film forming width has a lower limit. Further, in the above-mentioned structure, each light emitting unit is provided with a light emitting layer of a primary color, and each light emitting unit has a width which can not be smaller than the lower limit of the film forming width. Thus, each OLED on the substrate has a width which is not smaller than a product of the lower limit of the film forming width and a number of light emitting units, and this restricts increase in display resolution.

To this end, embodiments of the present invention provide a display substrate, a fabricating method thereof, and a display apparatus, for overcoming or alleviating one or more problems in the prior art.

In particular, the following technical solutions are adopted in embodiments of the present invention.

In a first aspect, it is provided a display substrate, which comprises a plurality of pixels, each of the pixels is divided into a plurality of light emitting units, each of the light emitting units comprises an anode, a cathode, a carrier transport layer, and a light emitting layer, wherein at least one of the plurality of light emitting units comprises a light emitting layer and at least one process auxiliary layer; and wherein the process auxiliary layer and the light emitting layer in other light emitting units are formed into an integral portion from a same material in a film forming process.

For example, the plurality of light emitting units comprise a first light emitting unit, a second light emitting unit, a third light emitting unit, and a fourth light emitting unit;

a light emitting layer of the first light emitting unit comprises a first light emitting layer, the second light emitting unit comprises a first process auxiliary layer and a second light emitting layer, the third light emitting unit comprises a third light emitting layer and a second process auxiliary layer, the fourth light emitting unit comprises a fourth light emitting layer;

wherein the first light emitting layer and the first process auxiliary layer are formed into an integral portion from a same material in a film forming process, the second light emitting layer and the third light emitting layer are formed into an integral portion from a same material in a film forming process, the second process auxiliary layer and the fourth light emitting layer are formed into an integral portion from a same material in a film forming process.

For example, a first barrier layer is arranged between the first process auxiliary layer and the second light emitting layer, a second barrier layer is arranged between the third light emitting layer and the second process auxiliary layer, wherein the first barrier layer and the second barrier layer are formed into an integral portion from a same material in a film forming process.

For example, the carrier transport layer comprises a hole transport layer, the hole transport layer of the first light emitting unit comprises a first hole transport layer and a second hole transport layer, the hole transport layer of the second light emitting unit comprises a third hole transport layer, a fourth hole transport layer, and a fifth hole transport layer, the hole transport layer of the third light emitting unit comprises a sixth hole transport layer and a seventh hole transport layer, the hole transport layer of the fourth light emitting unit comprises an eighth hole transport layer;

wherein the first hole transport layer, the third hole transport layer, the sixth hole transport layer, and the eighth hole transport layer are formed into an integral portion from a same material in a film forming process, and the second hole transport layer and the fourth hole transport layer are formed into an integral portion from a same material in a film forming process, and the fifth hole transport layer and the seventh hole transport layer are formed into an integral portion from a same material in a film forming process.

For example, the first light emitting unit corresponds to a micro-cavity with a cavity length of a first predefined cavity length, the second light emitting unit corresponds to a micro-cavity with a cavity length of a second predefined cavity length, the third light emitting unit corresponds to a micro-cavity with a cavity length of a third predefined cavity length, and the fourth light emitting unit corresponds to a micro-cavity with a cavity length of a fourth predefined cavity length.

For example, the anode in each of the light emitting units has a same thickness.

For example, the second light emitting layer and the third light emitting layer consist of a light emitting material in a frequency range comprising frequencies of red light and green light;

the first light emitting layer and the first process auxiliary layer consist of a light emitting material in a frequency range comprising a frequency of sky blue light; and the second process auxiliary layer and the fourth light emitting layer consist of a light emitting material in a frequency range comprising a frequency of deep blue light.

For example, the material of the second light emitting layer and the third light emitting layer comprises a first light emitting material and a second light emitting material, the first light emitting material is a light emitting material in a frequency range comprising a frequency of red light, and the second light emitting material is a light emitting material in a frequency range comprising a frequency of green light;

the first light emitting layer and the first process auxiliary layer consist of a light emitting material in a frequency range comprising a frequency of sky blue light; and the second process auxiliary layer and the fourth light emitting layer consist of a light emitting material in a frequency range comprising a frequency of deep blue light.

For example, the second light emitting layer and the third light emitting layer consist of a light emitting material in a frequency range comprising frequencies of red light and green light;

the first light emitting layer and the first process auxiliary layer consist of a light emitting material in a frequency range comprising a frequency of sky blue light; and the second process auxiliary layer and the fourth light emitting layer consist of a light emitting material in a frequency range comprising a frequency of green light.

For example, the material of the second light emitting layer and the third light emitting layer comprises a first light emitting material and a second light emitting material, the first light emitting material is a light emitting material in a frequency range comprising a frequency of red light, and the second light emitting material is a light emitting material in a frequency range comprising a frequency of green light;

the first light emitting layer and the first process auxiliary layer consist of a light emitting material in a frequency range comprising a frequency of sky blue light; and the second process auxiliary layer and the fourth light emitting layer consist of a light emitting material in a frequency range comprising a frequency of green light.

For example, the first barrier layer prevents carriers and excitons from transporting to the first process auxiliary layer, and the second barrier layer prevents carriers and excitons from transporting to the second process auxiliary layer.

In a second aspect, it is provided a display apparatus which comprises the above-mentioned display substrate.

In a third aspect, it is provided a method for fabricating a display substrate, wherein the display substrate comprises a plurality of pixels, each of the pixels is divided into a plurality of light emitting units, and the method comprises:

forming a first electrode of each light emitting unit on a substrate, and forming a carrier transport layer over the first electrode by a film forming process;

forming a light emitting layer over the carrier transport layer of a subset of the plurality of light emitting units by a film forming process;

forming a light emitting layer over the light emitting layer of at least one light emitting unit in the subset of light emitting units, and over the carrier transport layer of other light emitting units than the subset of light emitting units by a film forming process; wherein said at least one light emitting unit comprises a light emitting layer and a process auxiliary layer, and the process auxiliary layer and the light emitting layer in other light emitting units are formed into an integral portion from a same material in a film forming process;

forming a second electrode over the light emitting layer of each light emitting unit.

For example, said forming a light emitting layer over the light emitting layer of at least one light emitting unit in the subset of light emitting units, and over the carrier transport layer of other light emitting units than the subset of light emitting units by a film forming process comprises:

forming a barrier layer for blocking a first carrier and excitons over the light emitting layer of at least one light emitting unit in the subset of light emitting units by a film forming process;

forming a light emitting layer over the barrier layer of said at least one light emitting unit, and over the carrier transport layer of other light emitting units than the subset of light emitting units by a film forming process.

For example, the plurality of light emitting units comprise a first light emitting unit, a second light emitting unit, a third light emitting unit, and a fourth light emitting unit, and said forming a light emitting layer over the carrier transport layer of the subset of the plurality of light emitting units comprises:

forming a second light emitting layer over the carrier transport layer of the second light emitting unit, forming a third light emitting layer over the carrier transport layer of the third light emitting unit; wherein the second light emitting layer and the third light emitting layer are formed into an integral portion from a same material in a film forming process.

For example, said forming a barrier layer for blocking a first carrier and excitons over the light emitting layer of at least one light emitting unit in the subset of light emitting units comprises:

forming a first barrier layer for blocking the first carrier and excitons over the second light emitting layer, forming a second barrier layer for blocking the first carrier and excitons over the third light emitting layer; wherein the first barrier layer and the second barrier layer are formed into an integral portion from a same material in a film forming process.

For example, said forming a light emitting layer over the barrier layer of said at least one light emitting unit, and over the carrier transport layer of other light emitting units than the subset of light emitting units comprises:

forming a first process auxiliary layer over the first barrier layer, forming a first light emitting layer over the carrier transport layer of the first light emitting unit, forming a second process auxiliary layer over the second barrier layer, forming a fourth light emitting layer over the carrier transport layer of the fourth light emitting unit; wherein the first light emitting layer and the first process auxiliary layer are formed into an integral portion from a same material in a film forming process, the second process auxiliary layer and the fourth light emitting layer are formed into an integral portion from a same material in a film forming process.

For example, the carrier transport layer is a hole transport layer, the first electrode is an anode, the second electrode is a cathode, the first carrier is a hole;

and said forming a carrier transport layer over the first electrode comprises:

forming a first hole transport layer over the first electrode of the first light emitting unit, forming a third hole transport layer over the first electrode of the second light emitting unit, forming a sixth hole transport layer over the first electrode of the third light emitting unit, forming an eighth hole transport layer over the first electrode of the fourth light emitting unit; wherein the first hole transport layer, the third hole transport layer, the sixth hole transport layer, and the eighth hole transport layer are formed into an integral portion from a same material in a film forming process;

forming a second hole transport layer over the first hole transport layer of the first light emitting unit, forming a fourth hole transport layer over the third hole transport layer of the second light emitting unit; wherein the second hole transport layer and the fourth hole transport layer are formed into an integral portion from a same material in a film forming process;

forming a fifth hole transport layer over the fourth hole transport layer of the second light emitting unit, forming a seventh hole transport layer over the sixth hole transport layer of the third light emitting unit; wherein the fifth hole transport layer and the seventh hole transport layer are formed into an integral portion from a same material in a film forming process.

For example, the first electrode is an anode, the second electrode is a cathode, the carrier transport layer is a hole transport layer; and said forming a second electrode over the light emitting layer of each light emitting unit comprises:

forming in sequence an electron transport layer and a second electrode over the light emitting layer of each light emitting unit.

In a fourth aspect, it is provided a method for fabricating a light emitting component, the light emitting component comprises a plurality of light emitting units, and the method comprises:

forming a first electrode of each light emitting unit on a substrate, and forming a carrier transport layer over the first electrode by a film forming process;

forming a light emitting layer over the carrier transport layer of a subset of the plurality of light emitting units by a film forming process;

forming a light emitting layer over the light emitting layer of at least one light emitting unit in the subset of light emitting units, and over the carrier transport layer of other light emitting units than the subset of light emitting units by a film forming process; wherein said at least one light emitting unit comprises a light emitting layer and a process auxiliary layer, and the process auxiliary layer and the light emitting layer in other light emitting units are formed into an integral portion from a same material in a film forming process;

forming a second electrode over the light emitting layer of each light emitting unit.

For example, the light emitting component is an OLED.

Technical solutions in embodiment of the present invention have the following beneficial effects.

In embodiments of the present invention, a plurality of light emitting layers can be arranged in a light emitting unit, and these light emitting layers can and be formed in a same film forming process as the light emitting layer of neighboring light emitting units. Namely, a sum of widths of light emitting layers in two or more neighboring light emitting units amounts to a film forming width. In this way, the width of each light emitting component on the substrate can be smaller than a product of a lower limit of the film forming width and a number of light emitting units, so that display resolution can be improved.

BRIEF DESCRIPTION OF THE DRAWINGS

The accompanying drawings for describing embodiments of the present invention will be briefly described hereinafter, for purpose of illustrating technical solutions in these embodiments. Apparently, the drawings described below are merely some embodiments of the present invention. A person of ordinary skill in the art will conceive of other drawings on the basis of these drawings without creative efforts.

DETAILED DESCRIPTION OF THE INVENTION

Figure 1:
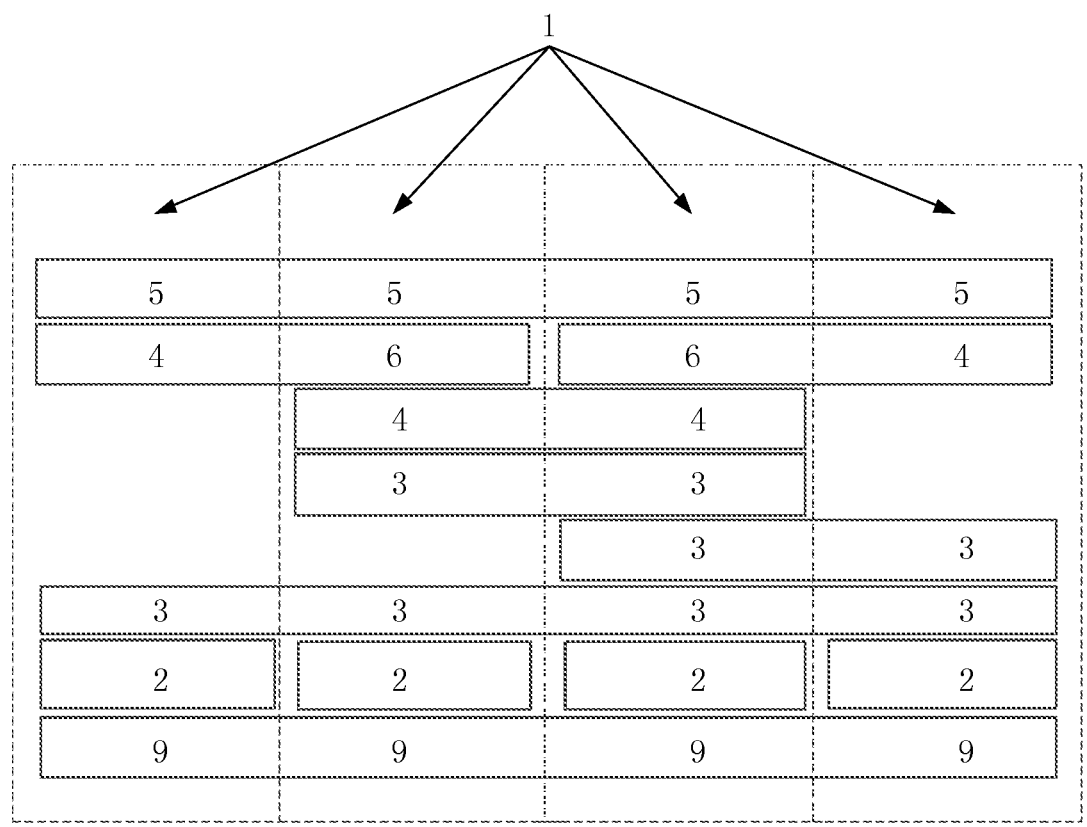
FIG. 1 is a partially structural view of a display substrate in an embodiment of the present invention.

In order to make objects, technical solutions and advantages of the present invention more clear, embodiments of the present invention will be described in details hereinafter in conjunction with the accompanying drawings.

REFERENCE NUMERALS 1 light emitting unit, 101 first light emitting unit, 102 second light emitting unit, 103 third light emitting unit, 104 fourth light emitting unit, 2 anode, 3 carrier transport layer, 4 light emitting layer, 401 first light emitting layer, 402 second light emitting layer, 403 third light emitting layer, 404 fourth light emitting layer, 5 cathode, 6 process auxiliary layer, 601 first process auxiliary layer, 602 second process auxiliary layer, 7 hole transport layer, 701 first hole transport layer, 702 second hole transport layer, 703 third hole transport layer, 704 fourth hole transport layer, 705 fifth hole transport layer, 706 sixth hole transport layer, 707 seventh hole transport layer, 708 eighth hole transport layer, 8 electron transport layer, 9 substrate, 10 barrier layer, 1001 first barrier layer, 1002 second barrier layer.

First Embodiment

An embodiment of the present invention provides a display substrate. The display substrate comprises a plurality of pixels, each of which is divided into a plurality of light emitting units 1. As shown in the cross-sectional view of FIG. 1, each of the light emitting units 1 comprises an anode 2, a carrier transport layer 3, a light emitting layer 4, and a cathode 5 on a substrate 9. At least one of the light emitting units 1 comprises one light emitting layer 4 and at least one process auxiliary layer 6. The above-mentioned process auxiliary layer 6 and the light emitting layer 4 in other light emitting units 1 are formed into an integral portion from a same material in a film forming process.

In an embodiment of the present invention, a plurality of light emitting layers can be arranged in the light emitting unit, and these light emitting layers can be formed by a same film forming process as light emitting layers in neighboring light emitting units. Namely, a sum of widths of light emitting layers in two or more neighboring light emitting units amounts to a film forming width. In this way, the width of each light emitting component on the substrate can be smaller than a product of a lower limit of the film forming width and a number of light emitting units, so that display resolution can be improved.

Second Embodiment

Any one of pixels in a display substrate shown in FIG. 1 will be described in details hereinafter by referring to specific embodiments. The display substrate comprises a plurality of pixels, and each of the pixels is divided into a plurality of light emitting units 1. Each of the light emitting units 1 comprises the anode 2, the carrier transport layer 3, the light emitting layer 4, and the cathode 5 which are arranged on the substrate 9. At least one of the light emitting units 1 comprises one light emitting layer 4 and at least one process auxiliary layer 6. The above-mentioned process auxiliary layer 6 and the light emitting layer 4 in other light emitting units 1 are formed into an integral portion from a same material in a film forming process.

A pixel can consist of a light emitting component, and the light emitting component can be an OLED. The anode 2 can consist of a material like a metal, a metal compound, or a conductive polymer, e.g., indium tin oxide (ITO), indium zinc oxide (IZO), or aluminum (Al). The carrier transport layer 3 can comprise a hole transport layer 7 and an electron transport layer 7, wherein the hole transport layer 7 can be formed by an organic material for transporting holes and blocking electrons, and the electron transport layer 7 can be formed by an organic material for transporting electrons and blocking holes. The light emitting layer 4 can be formed by a fluorescent matrix material. Upon being excited by excitons, the fluorescent matrix material can emit light in a frequency range. The cathode 5 can be formed an active metal like Ag, Mg. The anode or cathode can be a transparent electrode or translucent electrode as needed. Other light emitting units 1 can be light emitting units 1 other than the light emitting unit 1 in which at least one light emitting layer 4 is present. For example, other light emitting units 1 can be neighboring light emitting units 1. The process auxiliary layer 6 can be a light emitting layer which is not used for emitting light.

In implementations, in an OLED light emitting component of a structure shown in FIG. 1, two light emitting units 1 comprise one light emitting layer 4 and at least one the process auxiliary layer 6, respectively. The light emitting layer 4 and the process auxiliary layer 6 can be arranged longitudinally (i.e., in a direction perpendicular to the substrate 9). The process auxiliary layer 6 does not emit light, and the light emitting layer 4 emits light. In the above-mentioned structure, light emitting layers 4 of two or more neighboring light emitting units 1 and the process auxiliary layer 6 can be formed into an integral portion by a film forming process, so that the sum of their widths can amount to a film forming width. In this way, the width of each light emitting component on the substrate 9 can be smaller than the product of the lower limit of the film forming width and the number of light emitting units.

Figure 2:
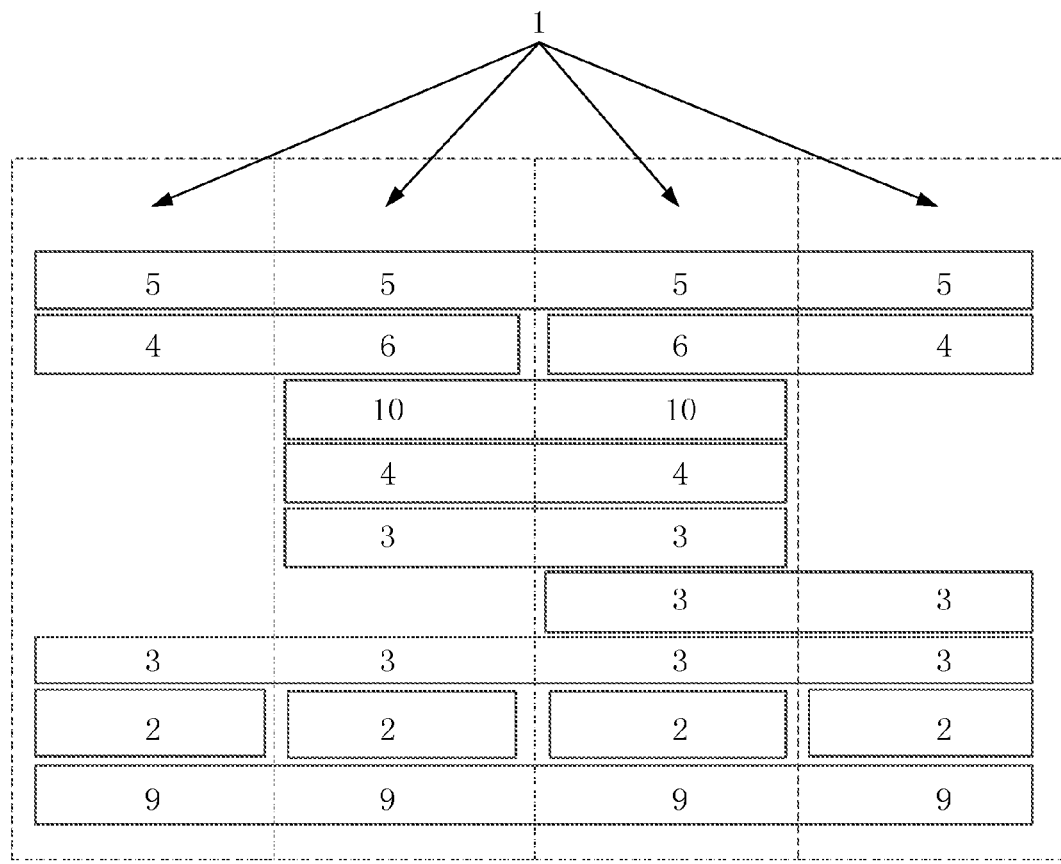
FIG. 2 is a partially structural view of a display substrate in an embodiment of the present invention.

For example, in order to improve light emitting efficiency of the OLED, a barrier layer 10 can be arranged between light emitting layers comprising two different primary colors in a same one light emitting unit, as shown in FIG. 2. In particular, the barrier layer 10 is arranged between these light emitting layers 4 and the process auxiliary layer 6 for blocking a first carrier and excitons, and the first carrier is a hole or electron.

The barrier layer 10 can be formed by an organic material which blocks the first carrier and excitons and transports a second carrier. The first carrier is different from the second carrier. Namely, if the first carrier is a hole, the second carrier is an electron. Otherwise, if the first carrier is an electron, the second carrier is a hole.

In implementations, as shown in FIG. 2, in order to prevent holes produced by the anode 2 from transporting to the process auxiliary layer 6 away from the anode 2 so that the process auxiliary layer 6 emits light, and prevent excitons produced in the light emitting layer 4 near the anode 2 from transporting to the light emitting layer 4 away from the anode 2 so that the light emitting layer 4 near the anode 2 emits light, the barrier layer 10 can be arranged between this light emitting layer 4 and the process auxiliary layer 6.

Figure 3:
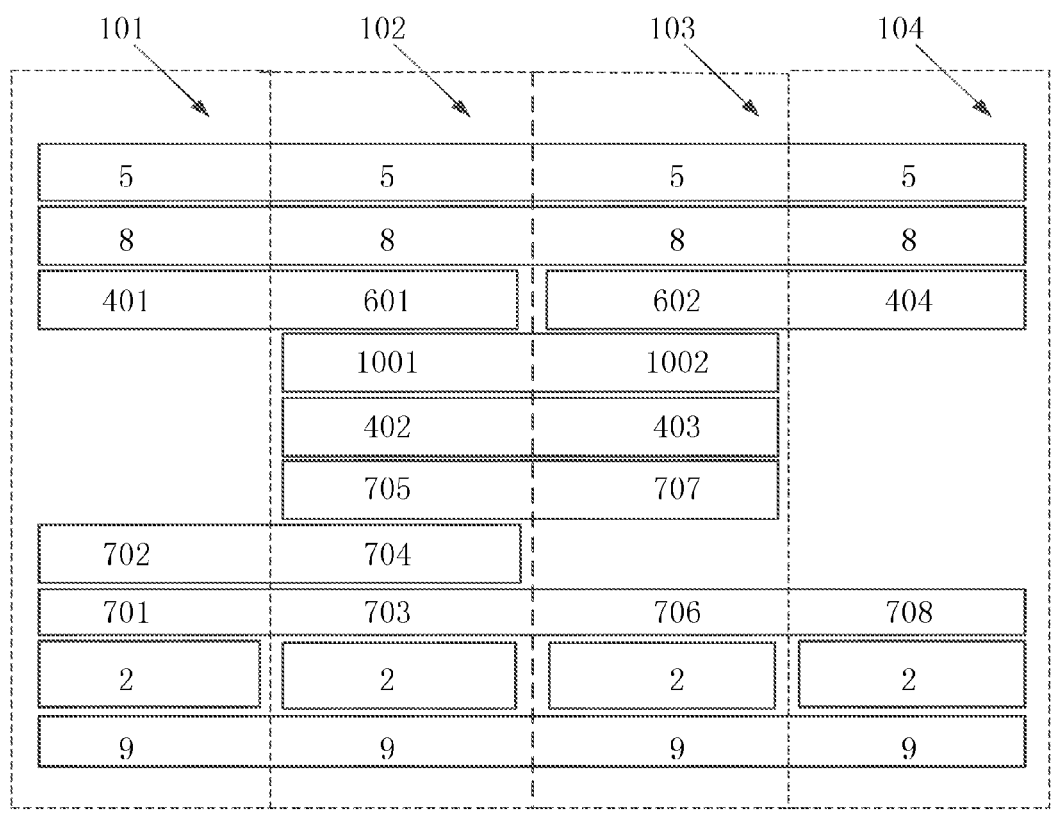
FIG. 3 is a partially structural view of a display substrate in an embodiment of the present invention.

For example, the plurality of light emitting units 1 can comprise four light emitting units, the light emitting layer 4 in each of which can be arranged in the following manner. As shown in FIG. 3, the plurality of light emitting units 1 comprise a first light emitting unit 101, a second light emitting unit 102, a third light emitting unit 103, and a fourth light emitting unit 104. The light emitting layer 4 of first light emitting unit 101 comprises a first light emitting layer 401, the second light emitting unit 102 comprises a second light emitting layer 402 and a first process auxiliary layer 601, the third light emitting unit 103 comprises a third light emitting layer 403 and a second process auxiliary layer 602, and the fourth light emitting unit 104 comprises a fourth light emitting layer 404. The first light emitting layer 401 and the first process auxiliary layer 601 are formed into an integral portion from a same material in a film forming process, the second light emitting layer 402 and the third light emitting layer 403 are formed into an integral portion from a same material in a film forming process, and the second process auxiliary layer 602 and the fourth light emitting layer 404 are formed into an integral portion from a same material in a film forming process.

In implementations, the OLED light emitting component can comprise four light emitting units 1, and thus can be referred to as four-pixel type OLED light emitting component. In each of the light emitting units 1, the anode 2 has a width smaller than or equal to ½ of the film forming width. The first light emitting layer 401 and the first process auxiliary layer 601 are formed into an integral portion from a same material in a film forming process, and the sum of their widths can equal to the film forming width. The second light emitting layer 402 and the third light emitting layer 403 are formed into an integral portion from a same material in a film forming process, and the sum of their widths can equal to the film forming width. The second process auxiliary layer 602 and the fourth light emitting layer 404 are formed into an integral portion from a same material in a film forming process, and the sum of their widths can equal to the film forming width. Furthermore, arrangement of the carrier transport layer 3 can be modified from the above-mentioned structure as needed. The width of the carrier transport layer 3 and the cathode 5 can amount to twice the film forming width.

When the anode 2 and the cathode 5 in the second light emitting unit 102 are energized, holes are transported from the anode 2 to the second light emitting layer 402 though the hole transport layer 7, and electrons are transported from the cathode 5 to the second light emitting layer 402 through an electron transport layer 8. In the second light emitting layer 402, holes and electrons are combined into excitons, which excite the second light emitting layer 402 to emit light. Further, due to presence of a first barrier layer 1001, holes and excitons can not be transported to the first process auxiliary layer 601. Thus, the first process auxiliary layer 601 can not emit light. Similarly, the third light emitting layer 403 in the third light emitting unit 103 can emit light, while the second process auxiliary layer 602 can not emit light.

It is noted that in the structure of the above-mentioned OLED light emitting component, the barrier layer 10 can be omitted. In this way, A same light emitting unit 1 may comprise one light emitting layer 4 and at least one process auxiliary layer 6 which are adjacent to each other. A skilled in the art can select suitable materials, and materials of these two layers have such carrier transport properties and/or energy level relationship that holes from the anode 2 or electrons from the cathode 5 can not or hardly reach the process auxiliary layer 6. In this way, in one of light emitting units 1, only the light emitting layer 4 emits light. For example, by taking the OLED structure of FIG. 3 as an example, the second light emitting layer 402 and the third light emitting layer 403 can comprise a light emitting material in which holes are transported relatively quickly, while electrons are transported very slowly. Accordingly, the first light emitting layer 401 and the first process auxiliary layer 601, as well as the second process auxiliary layer 602 and the fourth light emitting layer 404 can comprise a light emitting material in which electrons are transported relatively quickly while holes are transported very slowly. In this way, it is ensured to an extent that in the second light emitting unit 102 the second light emitting layer 402 emit light, while the first process auxiliary layer 601 can not emit light, and in the third light emitting unit 103 the third light emitting layer 403 can emit light, while the second process auxiliary layer 602 can not emit light.

For example, on the basis of arrangement of light emitting layers in the above-mentioned light emitting component, in order to improve Light emitting efficiency of OLED, a barrier layer can be arranged between light emitting layers. In particular, the first barrier layer 1001 is arranged between the second light emitting layer 402 and the first process auxiliary layer 601, and a second barrier layer 1002 is arranged between the third light emitting layer 403 and the second process auxiliary layer 602. The first barrier layer 1001 and the second barrier layer 1002 are formed into an integral portion from a same material in a film forming process.

In implementations, the first barrier layer 1001 and the second barrier layer 1002 are formed into an integral portion from a same material in a film forming process, and the sum of their widths can equal to the film forming width.

For example, light emitting layers in the light emitting component can be arranged in other manners than the above. One of optional arrangement manners is described as follow. The first light emitting unit can comprise a first light emitting layer, the second light emitting unit can comprise a second light emitting layer, the third light emitting unit can comprise a third light emitting layer, the fourth light emitting unit can comprise a process auxiliary layer and a fourth light emitting layer, a barrier layer can be arranged between the process auxiliary layer and the fourth light emitting layer, wherein the third light emitting layer and the process auxiliary layer are formed into an integral portion from a same material in a film forming process.

For example, on the basis of the specific arrangement manner of the above-mentioned light emitting layer 4, the carrier transport layer 3 in the OLED light emitting component can have various structures. An optional structure for the carrier transport layer 3 is described as follow, in which the carrier transport layer 3 comprises the hole transport layer 7, and the first carrier is a hole. As shown in FIG. 3, the hole transport layer 7 of the first light emitting unit 101 comprises a first hole transport layer 701 and a second hole transport layer 702; the hole transport layer 7 of the second light emitting unit 102 comprises a third hole transport layer 703, a fourth hole transport layer 704, and a fifth hole transport layer 705; the hole transport layer 7 of the third light emitting unit 103 comprises a sixth hole transport layer 706 and a seventh hole transport layer 707; the hole transport layer 7 of the fourth light emitting unit 104 comprises an eighth hole transport layer 708. The first hole transport layer 701, the third hole transport layer 703, the sixth hole transport layer 706, and the eighth hole transport layer 708 are formed into an integral portion from a same material in a film forming process. The second hole transport layer 702 and the fourth hole transport layer 704 are formed into an integral portion from a same material in a film forming process. The fifth hole transport layer 705 and the seventh hole transport layer 707 are formed into an integral portion from a same material in a film forming process.

In implementations, the hole transport layer 7 can be arranged in each of the light emitting units 1, and there are various manners for its arrangement. In particular, organic materials with hole transporting ability can be used as a material for the hole transport layer 7. The hole transport layer 7 can be formed by a film forming process form, such as vacuum thermal evaporation or the like. The first hole transport layer 701, the third hole transport layer 703, the sixth hole transport layer 706, and the eighth hole transport layer 708 are formed into an integral portion from a same material in a film forming process, and a sum of their widths can equal to twice the film forming width. The second hole transport layer 702 and the fourth hole transport layer 704 are formed into an integral portion from a same material in a film forming process, and a sum of their widths can equal to the film forming width. The fifth hole transport layer 705 and the seventh hole transport layer 707 are formed into an integral portion from a same material in a film forming process, and a sum of their widths can equal to the film forming width. With the above-mentioned structure, on the basis that the primary color of each of the light emitting units 1 is ensured, the thickness of each of the hole transport layers 7 and the thickness of the anodes 2 or the like can be set reasonably. In this case, each of the anodes 2 can have a same or different thickness. Further, on the basis that the primary color of each of the light emitting units 1 is ensured, the electron transport layer 8 can further be arranged between the light emitting layer and the cathode.

In another structure of the OLED light emitting component, the carrier transport layer 3 can comprise the electron transport layer 8, which is arranged in a same manner as the above-mentioned hole transport layer 7, and reference can be made to the arrangement manner of the above-mentioned hole transport layer 7, which is not repeated for simplicity.

It is noted that FIG. 1, FIG. 2 and FIG. 3 are merely logically structural views for a light emitting device in embodiments of the present invention. In a physical structure of the light emitting component, cavities are not present between neighboring layers. For example, the cavity between the first light emitting layer 401 and the second hole transport layer 702 in the first light emitting unit 101, the cavity between the sixth hole transport layer 706 and the seventh hole transport layer 707 in the third light emitting unit 103, and the cavity between the eighth hole transport layer 708 and the fourth light emitting layer 404 in the fourth light emitting unit 104, as shown in FIG. 3, are not present in the physical structure of the light emitting component.

It is noted that the above OLED light emitting component is only a pixel in the display substrate, and a plurality of the above-mentioned OLED light emitting components can be fabricated to form a plurality of pixels of the display substrate. The arrangement rules and manners of pixels on the display substrate can be set by the skilled in the art as needed.

For example, on the basis of the structure of the above OLED light emitting component, the anode 2 which each of the light emitting units 1 corresponds to can have various structure. An optional structure is described as follow. The anode 2 which each of the light emitting units 1 corresponds to has a same thickness.

Such a structure can simplify the etching process of the anode 2.

It is noted that in case the OLED light emitting component shown in FIG. 3 is a top emission OLED and the anode is made from ITO glass, an opaque reflective electrode can be arranged between an ITO glass plate and the substrate, for reflecting light emitted by the light emitting layer to a top layer of the OLED light emitting component, i.e., to the cathode. In this case, the cathode can be a transparent or translucent electrode.

For example, on the basis of the specific arrangement manners for the above-mentioned light emitting layer 4, the material for each light emitting layer 4 can be select in various manners, and some of these manners are described as follow.

In a first manner, the second light emitting layer 402 and the third light emitting layer 403 consist of a light emitting material in a frequency range comprising frequencies of red light and green light; or, the material of the second light emitting layer 402 and the third light emitting layer 403 comprises a first light emitting material and a second light emitting material, the first light emitting material is a light emitting material in a frequency range comprising a frequency of red light, and the second light emitting material is a light emitting material in a frequency range comprising a frequency of green light. The first light emitting layer 401 and the first process auxiliary layer 601 consist of a light emitting material in a frequency range comprising a frequency of sky blue light, and the second process auxiliary layer 602 and the fourth light emitting layer 404 consist of a light emitting material in a frequency range comprising a frequency of deep blue light. The sky blue light refers to a light with a wavelength range of 470 nm-485 nm, and the deep blue light refers to a light with a wavelength range of 450 nm-465 nm.

In implementations, OLED light emitting layers in the light emitting component 4 can be formed from a light emitting material by a film forming process. The light emitting material can be organic materials. For example, a polymer like tris-(8-hydroxyquinoline) aluminum (Alq3) is a light emitting material, which can emit light in a frequency range when it is excited by excitons. In practical applications, as for some light emitting materials, a primary color in the corresponding frequency range can be selected as the primary color of a certain light emitting unit 1. Further, two primary colors in the corresponding frequency range can be selected as primary colors for two light emitting units 1. In this way, although the second light emitting layer 402 and the third light emitting layer 403 are made into an integral portion from a same material in a film forming process, frequencies of light emitted by the material comprise frequencies of red light and green light. Thus, the second light emitting layer 402 and the third light emitting layer 403 can be used to emit light of different primary colors in different light emitting units 1, and whether it emits red light or green light depends on the cavity length of a micro-cavity which the light emitting unit corresponds to. The micro-cavity can be a miniature resonant cavity, and the cavity length can be a vertical distance between two interfaces which reflect light in the above-mentioned micro-cavity.

A light emitting material in a frequency range comprising a frequency of red light (i.e., the first light emitting material) can be mixed with a light emitting material in a frequency range comprising a frequency of green light (i.e., the second light emitting material), and formed into an integral portion. In this way, the second light emitting layer 402 and the third light emitting layer 403 can be formed into an integral portion from the above mixed materials by a film forming process. Whether the red light from the first light emitting material or the green light from the second light emitting material can be emitted through the transparent electrode depends on the cavity length of the micro-cavity which these light emitting units correspond to.

In a second manner, the second light emitting layer 402 and the third light emitting layer 403 consist of a light emitting material in a frequency range comprising frequencies of red light and green light; or, the material of the second light emitting layer 402 and the third light emitting layer 403 comprises a first light emitting material and a second light emitting material, the first light emitting material is a light emitting material in a frequency range comprising a frequency of red light, and the second light emitting material is a light emitting material in a frequency range comprising a frequency of green light. The first light emitting layer 401 and the first process auxiliary layer 601 consist of a light emitting material in a frequency range comprising a frequency of sky blue light; the second process auxiliary layer 602 and the fourth light emitting layer 404 consist of a light emitting material in a frequency range comprising a frequency of green light.

In implementations, the cavity length of the micro-cavity to which the light emitting units correspond can be adjusted, so that in the above OLED light emitting component, the first light emitting unit 101 emits green light. In this way, the primary color of each light emitting unit in the OLED light emitting component can be sky blue-green-red-green. Since a plurality of OLED light emitting components are arranged on the display substrate, and the corresponding primary color of each light emitting unit in each OLED light emitting component is sky blue-green-red-green, the above arrangement manner is a common way for improving display resolution. Thus, the resolution of display apparatus can be improved to an extent.

For example, on the basis of the specific arrangement manners for the above-mentioned light emitting layer 4, the cavity length of the micro-cavity to which each light emitting unit in the OLED light emitting component corresponds can be set as follow. The first light emitting unit 101 corresponds to a micro-cavity with a cavity length of a first predefined cavity length, the second light emitting unit 102 corresponds to a micro-cavity with a cavity length of a second predefined cavity length, the third light emitting unit 103 corresponds to a micro-cavity with a cavity length of a third predefined cavity length, and the fourth light emitting unit 104 corresponds to a micro-cavity with a cavity length of a fourth predefined cavity length.

In implementations, a thickness of the carrier transport layer and/or anode in each light emitting unit can be adjusted to set the cavity length of the micro-cavity to which the light emitting units correspond. The cavity length of the micro-cavity to which each light emitting units corresponds determines the primary color of each light emitting unit.

In embodiments of the present invention, a plurality of light emitting layers can be arranged in the light emitting unit. The light emitting layer can and a light emitting layer in a neighboring light emitting unit can be formed in a film forming process. Namely, a sum of widths of light emitting layers in two or more neighboring light emitting units amounts to a film forming width. In this way, the width of each light emitting component on the substrate can be smaller than the product of the lower limit of the film forming width and the number of light emitting units, so that display resolution can be improved.

Third Embodiment

An embodiment of the present disclosure further provides a display apparatus, which comprises the display substrate in the above-mentioned embodiments. The display apparatus can be a display panel, display, smart TV, mobile phone, tablet computer, or the like.

In embodiments of the present invention, a plurality of light emitting layers can be arranged in the light emitting unit. The light emitting layer can and a light emitting layer in a neighboring light emitting unit can be formed in a film forming process. Namely, a sum of widths of light emitting layers in two or more neighboring light emitting units amounts to a film forming width. In this way, the width of each light emitting component on the substrate can be smaller than the product of the lower limit of the film forming width and the number of light emitting units, so that display resolution can be improved.

Fourth Embodiment

Figure 4:
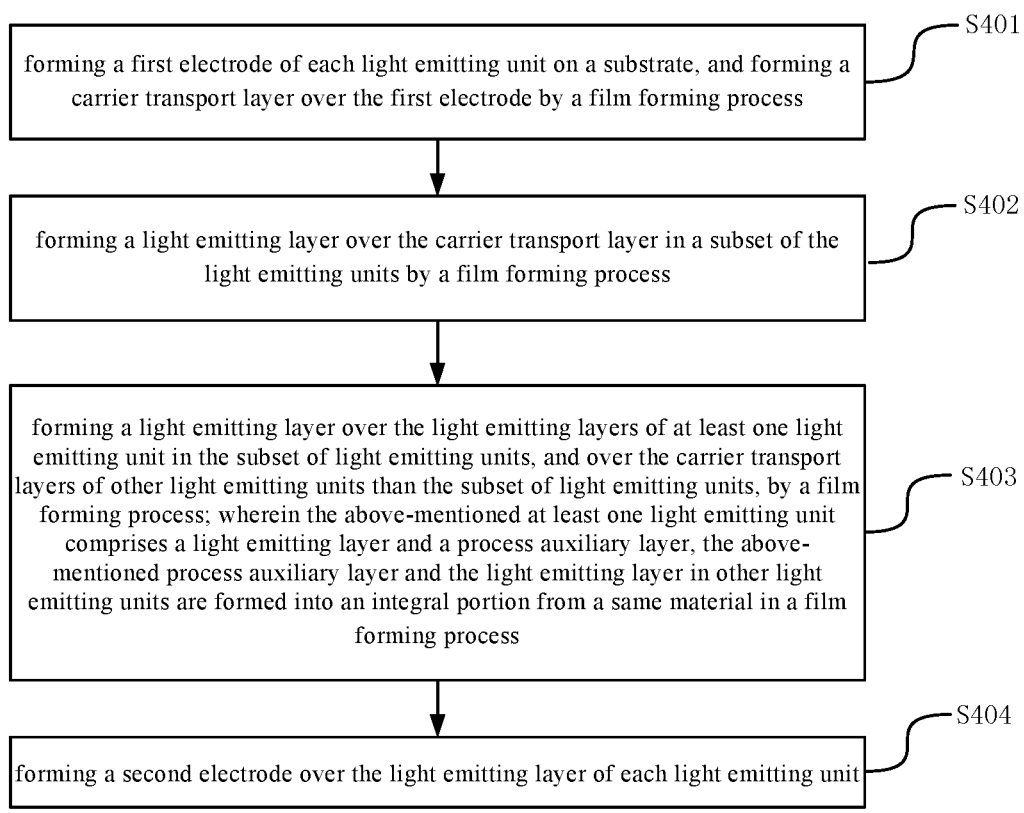
FIG. 4 is a flow chart of a method for fabricating a display substrate in an embodiment of the present invention.

Based on the same technical concept, an embodiment of the present invention provides a method for fabricating a display substrate. As shown in FIG. 4, the display substrate is divided into a plurality of light emitting units, and the method can comprise the following steps:

Step S401, forming a first electrode of each light emitting unit on a substrate, and forming a carrier transport layer over the first electrode by a film forming process;

Step S402, forming a light emitting layer over the carrier transport layer in a subset of the light emitting units by a film forming process;

Step S403, forming a light emitting layer over the light emitting layers of at least one light emitting unit in the subset of light emitting units, and over the carrier transport layers of other light emitting units than the subset of light emitting units by a film forming process; wherein the above-mentioned at least one light emitting unit comprises a light emitting layer and a process auxiliary layer, the above-mentioned process auxiliary layer and the light emitting layer in other light emitting units are formed into an integral portion from a same material in a film forming process.

Step S404, forming a second electrode over the light emitting layer of each light emitting unit.

In embodiments of the present invention, a plurality of light emitting layers can be arranged in the light emitting unit. The light emitting layer can and a light emitting layer in a neighboring light emitting unit can be formed in a film forming process. Namely, a sum of widths of light emitting layers in two or more neighboring light emitting units amounts to a film forming width. In this way, the width of each light emitting component on the substrate can be smaller than the product of the lower limit of the film forming width and the number of light emitting units, so that display resolution can be improved.

Fifth Embodiment

Based on the same technical concept, an embodiment of the present invention provides a method for fabricating a light emitting component, the light emitting component can be an OLED, and the light emitting component can be divided into a plurality of light emitting units.

A method for fabricating a light emitting component shown in FIG. 4 will be described in details hereinafter by referring to specific embodiments.

Step S401, forming a first electrode of each light emitting unit on a substrate, and forming a carrier transport layer over the first electrode by a film forming process.

The first electrode can be an anode or cathode, the first electrode can be made from ITO, IZO or Al, the film forming process can be vacuum thermal evaporation, organic vapor deposition, spin coating or ink-jet printing, or the like.

In implementations, the skilled in the art can a conductive material of excellent electrical conductivity, e.g., an ITO glass, in case the first electrode is an anode. Then, the skilled in the art can prepare a first electrode of a defined width and thickness by a machining process. For example, if the first electrode is an anode, the skilled in the art may perform photolithography on the ITO glass, and a resulting ITO glass plate is used as the anode of the OLED light emitting component. The resulting first electrode is subject to cleaning to remove contaminants like carbon on the surface, thus facilitating carriers being injected from the first electrode into organic materials of the carrier transport layer and the light emitting layer. Then, the resulting first electrode is arranged on the substrate. Further, a carrier transport layer can be arranged over the first electrode. Generally, the carrier transport layer is made from an organic material. It is known for the skilled in the art that a carrier transport layer can be formed over the first electrode by a film forming process. Generally, the organic material can be divided into two types, i.e., small molecule organic material and polymer organic material. The film forming process can be selected according to the type of organic material to be used in the OLED light emitting component. For example, as for the small molecule organic material, the film forming process like vacuum thermal evaporation or organic vapor deposition can be applied to form the corresponding organic material film. As for the polymer organic material, the film forming process like spin coating or ink-jet printing can be applied to form the corresponding organic material film.

Step S402, forming a light emitting layer over the carrier transport layer of the subset of the light emitting units by a film forming process.

In implementations, in case the subset of light emitting units comprises more than one light emitting unit, the light emitting layer can be formed in a single film forming process, but can also be formed separately in film forming processes.

Step S403, forming a light emitting layer over the light emitting layer of at least one light emitting unit in the subset of light emitting units, and over the carrier transport layer of other light emitting units than the subset of light emitting units by a film forming process; wherein the above-mentioned at least one light emitting unit comprises a light emitting layer and a process auxiliary layer, the above-mentioned process auxiliary layer and the light emitting layer in other light emitting units are formed into an integral portion from a same material in a film forming process.

In implementations, the skilled in the art can preset the primary color of light that each light emitting unit in the OLED light emitting component is required to emit. In case a light emitting unit comprises two light emitting layers (one of the light emitting layers is the process auxiliary layer), only one light emitting layer is required to emit light. For example, in an arrangement, the light emitting layer near the first electrode emits light, while the light emitting layer away from the first electrode does not emit light. In particular, the skilled in the art can select suitable light emitting materials, and the light emitting materials of these two light emitting layers have such carrier transport properties and/or energy level relationship that holes from the anode or electrons from the cathode can not or hardly reach one of the light emitting layers, thus realizing that only one light emitting layer in the light emitting unit emits light. For example, referring to the OLED structure of FIG. 3, the second light emitting layer and the third light emitting layer can be made from a light emitting material in which holes are transported relatively quickly while electrons are transported very slowly. Accordingly, the first light emitting layer and the first process auxiliary layer, as well as the second process auxiliary layer and the fourth light emitting layer can be made from a light emitting material in which electrons are transported relatively quickly while holes are transported very slowly. In the light emitting unit comprising light emitting layers which are arranged as above, there is at least one neighboring light emitting unit which belongs to other light emitting units than the subset of light emitting units. In this way, the light emitting layers formed over this light emitting layer and over the carrier transport layer in other light emitting units can be formed into an integral portion from a same material in a single film forming process.

For example, the above-mentioned step S403 can be performed in various manners. One of the optional manners is described, which comprises the following steps:

Step 1, forming a barrier layer for blocking a first carrier and excitons over the light emitting layer of at least one light emitting unit in the subset of light emitting units by a film forming process; wherein the first carrier is a hole or electron.

In implementations, in order to realize the above process in which only one light emitting layer is required to emit light, a barrier layer can be arranged between two light emitting layers. The barrier layer can be formed in a single film forming process, but can also be formed separately in film forming processes Step 2, forming a light emitting layer over the barrier layer of the above-mentioned at least one light emitting unit, and over the carrier transport layer of other light emitting units than the subset of light emitting units by a film forming process.

Reference can be made to the above described content for the process of step 2, which is not repeated for simplicity.

Step S404, forming a second electrode over the light emitting layer of each light emitting unit.

In implementations, cathodes of all light emitting units can also be formed into an integral portion from a same material by a film forming process. The process for cathodes is similar with that for the carrier transport layer. Reference can be made to the above described carrier transport layer, which is not repeated for simplicity.

For example, other carrier transport layers can be arranged between the light emitting layer and the second electrode. An optional way is described as follow. In case the first electrode is an anode, the second electrode is a cathode, and the carrier transport layer is a hole transport layer, the above-mentioned step S404 can accordingly comprise: forming in sequence an electron transport layer and a second electrode over the light emitting layer of each light emitting unit.

It is noted that if the OLED light emitting component shown in FIG. 3 which is fabricated by the above method is a top emission OLED, the first electrode is an anode, and the first electrode is made from an ITO glass, an opaque reflective electrode can be arranged between the ITO glass plate and the substrate. The opaque reflective electrode is used to reflect light emitted by the light emitting layer to a top layer of the OLED light emitting component, i.e., the cathode. In this case, the cathode can be a transparent or translucent electrode.

Figure 5:
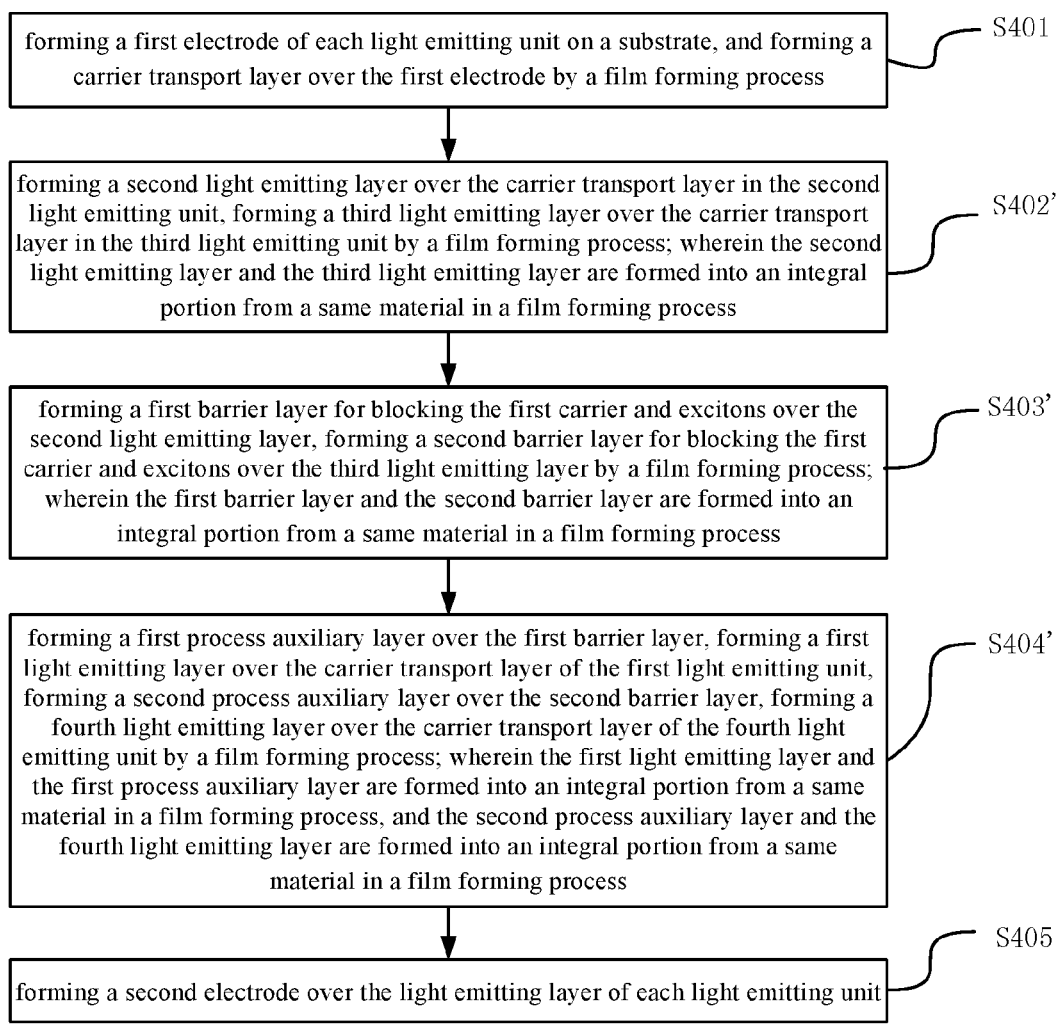
FIG. 5 is a flow chart of a method for fabricating a display substrate in an embodiment of the present invention.

For example, the plurality of light emitting units in the OLED light emitting component can comprise a first light emitting unit, a second light emitting unit, a third light emitting unit, and a fourth light emitting unit, the OLED light emitting component has a structure shown in FIG. 1, and the above steps S401-S404 can follow the process shown in FIG. 5 and comprise the following steps:

Step S401, forming a first electrode of each light emitting unit on a substrate, and forming a carrier transport layer over the first electrode by a film forming process.

For example, the carrier transport layer can be formed in various manners. In case the carrier transport layer is a hole transport layer, the first electrode is an anode, the second electrode is a cathode, the carrier transport layer can be formed in the following manner: forming a first hole transport layer the first electrode in the first light emitting unit, forming a third hole transport layer over the first electrode in the second light emitting unit, forming a sixth hole transport layer over the first electrode in the third light emitting unit, forming an eighth hole transport layer over the first electrode in the fourth light emitting unit; wherein the first hole transport layer, the third hole transport layer, the sixth hole transport layer, and the eighth hole transport layer are formed into an integral portion from a same material in a film forming process; forming a second hole transport layer over the first hole transport layer in the first light emitting unit, forming a fourth hole transport layer over the third hole transport layer in the second light emitting unit; wherein the second hole transport layer and the fourth hole transport layer are formed into an integral portion from a same material in a film forming process; forming a fifth hole transport layer over the fourth hole transport layer in the second light emitting unit, forming a seventh hole transport layer over the sixth hole transport layer in the third light emitting unit; wherein the fifth hole transport layer and the seventh hole transport layer are formed into an integral portion from a same material in a film forming process.

In implementations, hole transport layers can firstly be formed in all light emitting units by a single film forming process, and the hole transport layers are formed in this way into an integral portion. Then, hole transport layers are formed in the first light emitting unit and the second light emitting unit by a single film forming process, and the hole transport layers are formed in this way into an integral portion. Finally, hole transport layers are formed in the second light emitting unit and the third light emitting unit by a single film forming process, and the hole transport layers are formed in this way into an integral portion. All of these hole transport layers can be made from a same material. The thickness to be formed in each film forming process can be preset as needed.

Step S402', forming a second light emitting layer over the carrier transport layer in the second light emitting unit, forming a third light emitting layer over the carrier transport layer in the third light emitting unit by a film forming process; wherein the second light emitting layer and the third light emitting layer are formed into an integral portion from a same material in a film forming process.

In implementations, the second light emitting layer and the third light emitting layer can be made from a light emitting material in a frequency range comprising two different frequencies of primary color light, and can also be formed by mixing two different light emitting materials. For example, the second light emitting layer and the third light emitting layer can consist of a light emitting material in a frequency range comprising frequencies of red light and green light, or the material of the second light emitting layer and the third light emitting layer comprises a first light emitting material and a second light emitting material, wherein the first light emitting material can be a light emitting material in a frequency range comprising a frequency of red light, and the second light emitting material can be a light emitting material in a frequency range comprising a frequency of green light. Although the second light emitting layer and the third light emitting layer are made from the same material, the respective light emitting unit in which these light emitting layers are arranged can emit light of different primary colors, and reference can be made to the second embodiment for relevant description, which is not repeated for simplicity.

Step S403', forming a first barrier layer for blocking the first carrier and excitons over the second light emitting layer, forming a second barrier layer for blocking the first carrier and excitons over the third light emitting layer by a film forming process; wherein the first barrier layer and the second barrier layer are formed into an integral portion from a same material in a film forming process.

In implementations, organic materials with the ability of blocking the first carrier and excitons and transporting the second carrier can be applied to form the barrier layer by a film forming process. The first carrier is different from the second carrier. Namely, if the first carrier is a hole, the second carrier is an electron, while if the first carrier is an electron, the second carrier is a hole. A sum of a width of the first barrier layer and that of the second barrier layer can equal to the film forming width. Due to the presence of the barrier layer, the first carrier from the first electrode is prevented from transporting to the third light emitting layer, and then to other light emitting layers. Thus, it is ensured that in a light emitting unit, only a light emitting layer can emit light.

Step S404', forming a first process auxiliary layer over the first barrier layer, forming a first light emitting layer over the carrier transport layer of the first light emitting unit, forming a second process auxiliary layer over the second barrier layer, forming a fourth light emitting layer over the carrier transport layer of the fourth light emitting unit by a film forming process; wherein the first light emitting layer and the first process auxiliary layer are formed into an integral portion from a same material in a film forming process, and the second process auxiliary layer and the fourth light emitting layer are formed into an integral portion from a same material in a film forming process.

Step S405, forming a second electrode over the light emitting layer of each light emitting unit.

It can be seen from the above process that the width of the fabricated OLED light emitting component on the substrate can be ½ the product of the lower limit of the film forming width and the number of light emitting units, so that display resolution can be improved.

It is noted that the above-mentioned method for fabricating a light emitting component can used for fabricating not only a four-pixel type OLED light emitting component, but also a there-pixel type OLED light emitting component. The structure of the three-pixel type OLED light emitting component can be set as needed, which is not repeated for simplicity.

In embodiments of the present invention, a plurality of light emitting layers can be arranged in the light emitting unit. The light emitting layer can and a light emitting layer in a neighboring light emitting unit can be formed in a film forming process. Namely, a sum of widths of light emitting layers in two or more neighboring light emitting units amounts to a film forming width. In this way, the width of each light emitting component on the substrate can be smaller than the product of the lower limit of the film forming width and the number of light emitting units, so that display resolution can be improved.

It is understood by the person of ordinary skill in the art that all or some steps in the above-mentioned embodiments can be realized by hardware, or by programs which instruct relevant hardware to conduct the steps. The programs can be stored in a computer readable medium, which can be read-only memory, disk, optical disc, or the like.

Although the present invention has been described above with reference to specific embodiments, it should be understood that the limitations of the described embodiments are merely for illustrative purpose and by no means limiting. Instead, the scope of the invention is defined by the appended claims rather than by the description, and all variations that fall within the range of the claims are intended to be embraced therein. Thus, other embodiments than the specific ones described above are equally possible within the scope of these appended claims.

The invention claimed is:

1. A display substrate, wherein the display substrate comprises a plurality of pixels, each of the pixels is divided into a plurality of light emitting units, each of the light emitting units comprises an anode, a cathode, a carrier transport layer, and a light emitting layer,
   wherein at least one of the plurality of light emitting units comprises a light emitting layer and at least one process auxiliary layer; and
   wherein the process auxiliary layer and the light emitting layer in other light emitting units are formed into an integral portion from a same material in a film forming process.

2. The display substrate of claim 1, wherein the plurality of light emitting units comprises a first light emitting unit, a second light emitting unit, a third light emitting unit, and a fourth light emitting unit;
   a light emitting layer of the first light emitting unit comprises a first light emitting layer, the second light emitting unit comprises a first process auxiliary layer and a second light emitting layer, the third light emitting unit comprises a third light emitting layer and a second process auxiliary layer, the fourth light emitting unit comprises a fourth light emitting layer;
   wherein the first light emitting layer and the first process auxiliary layer are formed into an integral portion from a same material in a film forming process, the second light emitting layer and the third light emitting layer are formed into an integral portion from a same material in a film forming process, the second process auxiliary layer and the fourth light emitting layer are formed into an integral portion from a same material in a film forming process.

3. The display substrate of claim 2, wherein a first barrier layer is arranged between the first process auxiliary layer and the second light emitting layer, a second barrier layer is arranged between the third light emitting layer and the second process auxiliary layer, wherein the first barrier layer and the second barrier layer are formed into an integral portion from a same material in a film forming process.

4. The display substrate of claim 2, wherein the carrier transport layer comprises a hole transport layer, the hole transport layer of the first light emitting unit comprises a first hole transport layer and a second hole transport layer, the hole transport layer of the second light emitting unit comprises a third hole transport layer, a fourth hole transport layer, and a fifth hole transport layer, the hole transport layer of the third light emitting unit comprises a sixth hole transport layer and a seventh hole transport layer, the hole transport layer of the fourth light emitting unit comprises an eighth hole transport layer;

wherein the first hole transport layer, the third hole transport layer, the sixth hole transport layer, and the eighth hole transport layer are formed into an integral portion from a same material in a film forming process, and the second hole transport layer and the fourth hole transport layer are formed into an integral portion from a same material in a film forming process, and the fifth hole transport layer and the seventh hole transport layer are formed into an integral portion from a same material in a film forming process.

5. The display substrate of claim 4, wherein the first light emitting unit corresponds to a micro-cavity with a cavity length of a first predefined cavity length, the second light emitting unit corresponds to a micro-cavity with a cavity length of a second predefined cavity length, the third light emitting unit corresponds to a micro-cavity with a cavity length of a third predefined cavity length, and the fourth light emitting unit corresponds to a micro-cavity with a cavity length of a fourth predefined cavity length.

6. The display substrate of claim 4, wherein the anode in each of the light emitting units has a same thickness.

7. The display substrate of claim 2, wherein the second light emitting layer and the third light emitting layer consist of a light emitting material in a frequency range comprising frequencies of red light and green light;

the first light emitting layer and the first process auxiliary layer consist of a light emitting material in a frequency range comprising a frequency of sky blue light; and
the second process auxiliary layer and the fourth light emitting layer consist of a light emitting material in a frequency range comprising a frequency of deep blue light.

8. The display substrate of claim 2, wherein the material of the second light emitting layer and the third light emitting layer comprises a first light emitting material and a second light emitting material, the first light emitting material is a light emitting material in a frequency range comprising a frequency of red light, and the second light emitting material is a light emitting material in a frequency range comprising a frequency of green light;

the first light emitting layer and the first process auxiliary layer consist of a light emitting material in a frequency range comprising a frequency of sky blue light; and
the second process auxiliary layer and the fourth light emitting layer consist of a light emitting material in a frequency range comprising a frequency of deep blue light.

9. The display substrate of claim 2, wherein the second light emitting layer and the third light emitting layer consist of a light emitting material in a frequency range comprising frequencies of red light and green light;

the first light emitting layer and the first process auxiliary layer consist of a light emitting material in a frequency range comprising a frequency of sky blue light; and
the second process auxiliary layer and the fourth light emitting layer consist of a light emitting material in a frequency range comprising a frequency of green light.

10. The display substrate of claim 2, wherein the material of the second light emitting layer and the third light emitting layer comprises a first light emitting material and a second light emitting material, the first light emitting material is a light emitting material in a frequency range comprising a frequency of red light, and the second light emitting material is a light emitting material in a frequency range comprising a frequency of green light;

the first light emitting layer and the first process auxiliary layer consist of a light emitting material in a frequency range comprising a frequency of sky blue light; and
the second process auxiliary layer and the fourth light emitting layer consist of a light emitting material in a frequency range comprising a frequency of green light.

11. The display substrate of claim 3, wherein the first barrier layer prevents carriers and excitons from transporting to the first process auxiliary layer, and the second barrier layer prevents carriers and excitons from transporting to the second process auxiliary layer.

12. A display apparatus, wherein the display apparatus comprises the display substrate of claim 1.

13. A method for fabricating a display substrate, wherein the display substrate comprises a plurality of pixels, each of the pixels is divided into a plurality of light emitting units, and the method comprises:

forming a first electrode of each light emitting unit on a substrate, and forming a carrier transport layer over the first electrode by a film forming process;
forming a light emitting layer over the carrier transport layer of a subset of the plurality of light emitting units by a film forming process;
forming a light emitting layer over the light emitting layer of at least one light emitting unit in the subset of light emitting units, and over the carrier transport layer of other light emitting units than the subset of light emitting units by a film forming process; wherein said at least one light emitting unit comprises a light emitting layer and a process auxiliary layer, and the process auxiliary layer and the light emitting layer in other light emitting units are formed into an integral portion from a same material in a film forming process;
forming a second electrode over the light emitting layer of each light emitting unit.

14. The method of claim 13, wherein said forming a light emitting layer over the light emitting layer of at least one light emitting unit in the subset of light emitting units, and over the carrier transport layer of other light emitting units than the subset of light emitting units by a film forming process comprises:

forming a barrier layer for blocking a first carrier and excitons over the light emitting layer of at least one light emitting unit in the subset of light emitting units by a film forming process;
forming a light emitting layer over the barrier layer of said at least one light emitting unit, and over the carrier transport layer of other light emitting units than the subset of light emitting units by a film forming process.

15. The method of claim 14, wherein the plurality of light emitting units comprise a first light emitting unit, a second light emitting unit, a third light emitting unit, and a fourth light emitting unit, and said forming a light emitting layer over the carrier transport layer of the subset of the plurality of light emitting units comprises:
forming a second light emitting layer over the carrier transport layer of the second light emitting unit, forming a third light emitting layer over the carrier transport layer of the third light emitting unit; wherein the second light emitting layer and the third light emitting layer are formed into an integral portion from a same material in a film forming process.

16. The method of claim 15, wherein said forming a barrier layer for blocking a first carrier and excitons over the light emitting layer of at least one light emitting unit in the subset of light emitting units comprises:
forming a first barrier layer for blocking the first carrier and excitons over the second light emitting layer, forming a second barrier layer for blocking the first carrier and excitons over the third light emitting layer; wherein the first barrier layer and the second barrier layer are formed into an integral portion from a same material in a film forming process.

17. The method of claim 15, wherein said forming a light emitting layer over the barrier layer of said at least one light emitting unit, and over the carrier transport layer of other light emitting units than the subset of light emitting units comprises:
forming a first process auxiliary layer over the first barrier layer, forming a first light emitting layer over the carrier transport layer of the first light emitting unit, forming a second process auxiliary layer over the second barrier layer, forming a fourth light emitting layer over the carrier transport layer of the fourth light emitting unit; wherein the first light emitting layer and the first process auxiliary layer are formed into an integral portion from a same material in a film forming process, the second process auxiliary layer and the fourth light emitting layer are formed into an integral portion from a same material in a film forming process.

18. The method of claim 15, wherein the carrier transport layer is a hole transport layer, the first electrode is an anode, the second electrode is a cathode, the first carrier is a hole;
and said forming a carrier transport layer over the first electrode comprises:
forming a first hole transport layer over the first electrode of the first light emitting unit, forming a third hole transport layer over the first electrode of the second light emitting unit, forming a sixth hole transport layer over the first electrode of the third light emitting unit, forming an eighth hole transport layer over the first electrode of the fourth light emitting unit; wherein the first hole transport layer, the third hole transport layer, the sixth hole transport layer, and the eighth hole transport layer are formed into an integral portion from a same material in a film forming process;
forming a second hole transport layer over the first hole transport layer of the first light emitting unit, forming a fourth hole transport layer over the third hole transport layer of the second light emitting unit; wherein the second hole transport layer and the fourth hole transport layer are formed into an integral portion from a same material in a film forming process;
forming a fifth hole transport layer over the fourth hole transport layer of the second light emitting unit, forming a seventh hole transport layer over the sixth hole transport layer of the third light emitting unit; wherein the fifth hole transport layer and the seventh hole transport layer are formed into an integral portion from a same material in a film forming process.

19. The method of claim 13, wherein the first electrode is an anode, the second electrode is a cathode, the carrier transport layer is a hole transport layer; and said forming a second electrode over the light emitting layer of each light emitting unit comprises:
forming in sequence an electron transport layer and a second electrode over the light emitting layer of each light emitting unit.

20. A method for fabricating a light emitting component, the light emitting component comprises a plurality of light emitting units, the method comprises:
forming a first electrode of each light emitting unit on a substrate, and forming a carrier transport layer over the first electrode by a film forming process;
forming a light emitting layer over the carrier transport layer of a subset of the plurality of light emitting units by a film forming process;
forming a light emitting layer over the light emitting layer of at least one light emitting unit in the subset of light emitting units, and over the carrier transport layer of other light emitting units than the subset of light emitting units by a film forming process; wherein said at least one light emitting unit comprises a light emitting layer and a process auxiliary layer, and the process auxiliary layer and the light emitting layer in other light emitting units are formed into an integral portion from a same material in a film forming process;
forming a second electrode over the light emitting layer of each light emitting unit.

* * * * *